(12) United States Patent
Kawk et al.

(10) Patent No.: US 7,852,048 B2
(45) Date of Patent: Dec. 14, 2010

(54) DEVICE AND METHODS FOR SUPPLYING INSTANT HIGH POWER TO SMALL ARMS FIRE CONTROL SYSTEM

(76) Inventors: Ki-Ho Kawk, 701-1501 Yeolmaemauel Apt., Jijok-dong, Yuseong-gu, Daejeon-si (KR); Jung-Ho Ko, 5-1105 Karam Apt., Samchun-dong 986, Seo-gu, Daejeon-si (KR); Joo-Hong Yoon, 176-3 Juk-dong, Yuseong-gu, Daejeon-si (KR)

( * ) Notice: Subject to any disclaimer, the term of this patent is extended or adjusted under 35 U.S.C. 154(b) by 522 days.

(21) Appl. No.: 11/944,869

(22) Filed: Nov. 26, 2007

(65) Prior Publication Data
US 2008/0129270 A1 Jun. 5, 2008

(30) Foreign Application Priority Data
Nov. 24, 2006 (KR) ................. 10-2006-0116784

(51) Int. Cl.
*H02J 7/00* (2006.01)
(52) U.S. Cl. ..................... 320/167; 320/166
(58) Field of Classification Search ............. 320/167
See application file for complete search history.

(56) References Cited
U.S. PATENT DOCUMENTS

| 5,498,951 A * | 3/1996 | Okamura et al. ............ 322/2 R |
| 2004/0155631 A1 * | 8/2004 | Ishizu ........................ 320/166 |
| 2007/0001651 A1 * | 1/2007 | Harvey ........................ 320/166 |

OTHER PUBLICATIONS

ATmega32L Datasheet, Atmel, 8-bit AVR Microcontroller with 32K Bytes In-System Programmable Flash, 347 pages, revision updated Oct. 2006 (www.atmel.com).

Cap-XX Application Note No. 1001: Current-Limit and Low Voltage Lockout Circuit for Portable Devices, 5 pages, Dec. 2001 (www.cap-xx.com).
Cap-XX Application Note No. 1002: Start-Up Current-Limiters for Supercapacitors in PDAs and Other Portabel Devices, 14 pages, Revision 2.1, Feb. 2002 (www.cap-xx.com).
Cap-XX Application Note No. 1003: The Supercapacitor Solution to GPRS and Other Pulsed Loads on CompactFlash and PC Cards, 27 pages, Revision 1.0, Dec. 2002 (www.cap-xx.com).
Cap-XX Application Note No. 1004: Driving High-Power White LED Flash in Camera Phones, 15 pages, Rev. 1.0, May 2005 (www.cap-xx.com).
Cap-XX, How to Use the Current-Limiter Component Calculator Spreadsheet, Companion Spreadsheet Start-up Current-Limiter Application Note No. 1002, 2 pages, (www.cap-xx.com).

* cited by examiner

*Primary Examiner*—Edward Tso
*Assistant Examiner*—M'Baye Diao
(74) *Attorney, Agent, or Firm*—McDonnell Boehnen Hulbert & Berghoff LLP

(57) ABSTRACT

The present invention relates to a power supply device of a small arms fire control system or a similar small arms system. The device includes a first current limit part for limiting a low current when power is supplied from a battery, a second current limit part for limiting a high current when the power is supplied from the battery, a Zener diode and a step-up DC-DC boost converter connected to the first and second current limit parts, and adapted to primarily charge a supercapacitor to a battery voltage level and subsequently charge the supercapacitor up to a final voltage that will be supplied to a load, and a microprocessor for checking a power supply state of the system and a voltage of the supercapacitor in real-time and controlling ON/OFF of the first and second current limit parts used in the system. An instant high power is supplied to the load using a variable current limit and multi-step charging method.

10 Claims, 4 Drawing Sheets

DEVICE AND METHODS FOR SUPPLYING INSTANT HIGH POWER TO SMALL ARMS FIRE CONTROL SYSTEM

BACKGROUND OF THE INVENTION

1. Field of the Invention

The present invention relates to a power supply device of a small arms fire control system and a similar military/civilian power supply device, which are driven using a battery and an electric double layer capacitor (hereinafter, referred to as a "supercapacitor") and require instant high power.

2. Background of the Related Art

In general, a small arms fire control system must be driven using only a battery for portability and must have a main control board and an infrared processing board driven within a maximum continuous discharging current range of the battery. The fire control system must also be able to supply power to devices requiring an instant high power necessary for the driving of a laser range finder module and an infrared shutter and energy charging of a fuse setter within a range of the greatest pulse discharging current.

In a state where an average current of 1.5 A is continuously supplied from the battery to the system, current of 1.5 A must be supplied for a specific time (for example, 0.5 second) every 5-second cycle. To this end, it is required to use a battery having a sufficiently high capacity or a supercapacitor that can compensate for an instant high current.

Thus, the most appropriate method of stably supplying power to a small arms system, which is driven by a battery and portable, is to design a power supply device having a combination of the battery and the supercapacitor.

However, this method also entails a problem in that excessive current is needed by the battery upon the initial charging of the capacitor, thereby causing damage to the battery.

Therefore, the existing power supply devices using the battery and the supercapacitor employ a current limit circuit or a chip in order to prevent excessive current required to charge the capacitor. The current limit circuit or chip always limits the current to a fixed current value irrespective of the power supply state of a system. Accordingly, an efficient use of the system power is inevitable and, therefore, there occurs a problem in that the charging time of the supercapacitor is lengthened.

In particular, this problem is more important in such a small arms fire control system, wherein a normal operation of the system is guaranteed within a constant battery capacity and accurate power control is needed in order to stably supply an instant high power necessary for driving of a laser range finder module and an infrared shutter and energy charging of a fuse setter.

Particularly, in the case of a small arms fire control system that is driven using a single battery so as to minimize the size of an overall system, required power must be stably supplied to loads requiring voltage, which is several times to several hundreds of times greater than the battery voltage. To this end, a step-up DC-DC boost converter for boosting the battery voltage and the supercapacitor for supplying an instant high power are necessarily required.

Furthermore, in the case of a load that stably requires a voltage of several hundreds of volts for several milliseconds, such as the laser range finder module, a battery voltage must be primarily boosted using the step-up DC-DC boost converter and then supplied to the step-up DC-DC boost converter for the laser range finder module. At this time, if the supercapacitor is fully charged by the primarily boosted voltage, a high initial inrush current is generated, which may give great damage to the supercapacitor and other components.

When considering that an average efficiency of the step-up DC-DC boost converter reaches 80 to 85%, there also occurs a problem in that the charging efficiency is reduced.

SUMMARY OF THE INVENTION

Accordingly, the present invention has been made in view of the above problems occurring in the prior art, and it is an object of the present invention to provide a method of designing a power supply device, wherein in designing a small arms fire control system that is driven under limited power conditions, such as a battery, and a similar power supply device of a small arms system, a limit current value supplied to the supercapacitor can be varied depending on the power state of a system using a power control microprocessor, the influence of the inrush current occurring upon initial charging of the supercapacitor can be minimized, and the charging efficiency can be improved.

To achieve the above object, according to the present invention, there is provided a power supply device of a small arms fire control system or a similar small arms system, including a first current limit part for limiting a low current when power is supplied from a battery, a second current limit part for limiting a high current when the power is supplied from the battery, a Zener diode and a step-up DC-DC boost converter connected to the first and second current limit parts, and adapted to primarily charge a supercapacitor to a battery voltage level and subsequently charge the supercapacitor up to a final voltage that will be supplied to a load, and a microprocessor for checking a power supply state of the system and a voltage of the supercapacitor in real-time and controlling ON/OFF of the first and second current limit parts used in the system. An instant high power is supplied to the load using a variable current limit and multi-step charging method.

The Zener diode functions to limit an initial inrush current.

When the first current limit part is supplied with power from the battery, it is turned on. If the supercapacitor is fully charged and the system is stabilized, the second current limit part is turned on.

When the high power is supplied to the load, the step-up DC-DC boost converter is turned on.

Two current limit parts having different limit current values are used, the power states of other electronic boards within a system are determined in real-time, and a current limit part is switched based on the determination result. Thus, the limit current value can be changed and therefore power can be supplied to the system stably within a range of a continuous discharging current of a limited battery. Further, in charging the supercapacitor, the power control microprocessor monitors the charging voltage of the supercapacitor in real-time while firstly charging the capacitor through the Zener diode, and turns on the step-up DC-DC boost converter when the charging voltage of the supercapacitor reaches the same voltage level as that of the battery and then charges the capacitor up to the final voltage. Accordingly, the influence of an inrush current can be minimized and the charging efficiency of the supercapacitor can be increased, when compared with charging up to a final voltage through the step-up DC-DC boost converter from the start.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENT

The present invention will now be described in detail in connection with a specific embodiment with reference to the accompanying drawings.

Figure 1:
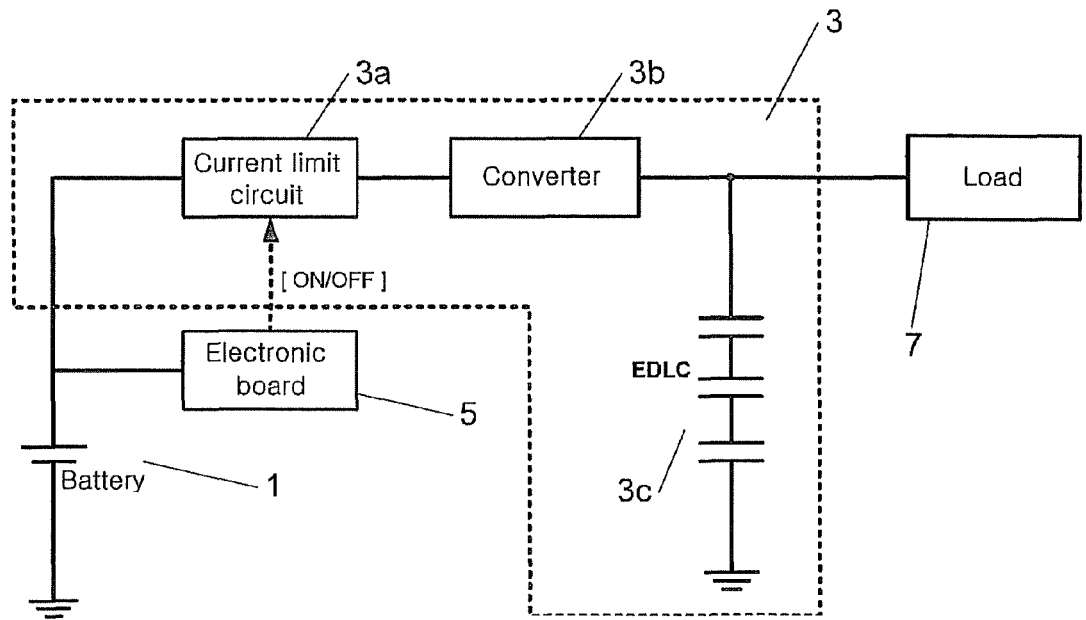
FIG. 1 shows a configuration of a general instant high power supply device.
Figure 2:
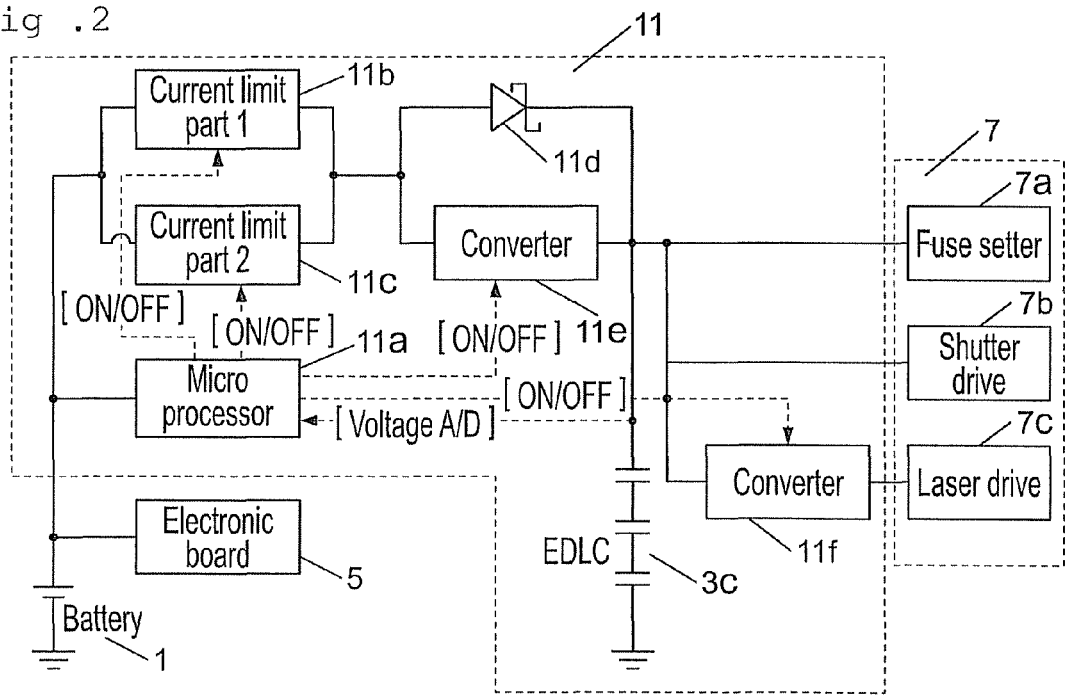
FIG. 2 is a configuration of an instant high power supply device for a small arms fire control system according to the present invention.
Figure 3:
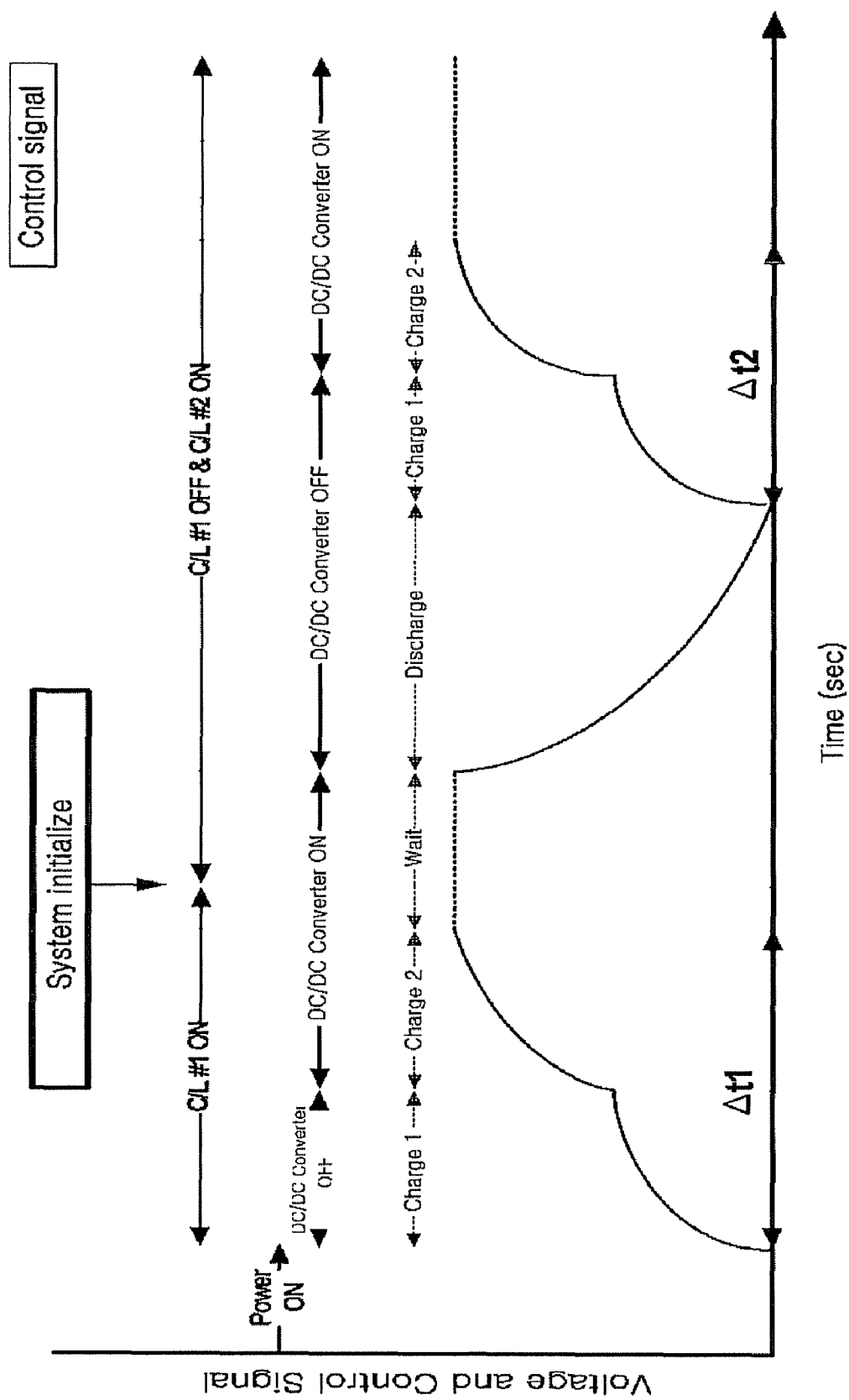
FIG. 3 is a graph showing signals of a power control microprocessor and a charging time of a supercapacitor accordingly, of the present invention.
Figure 4A:
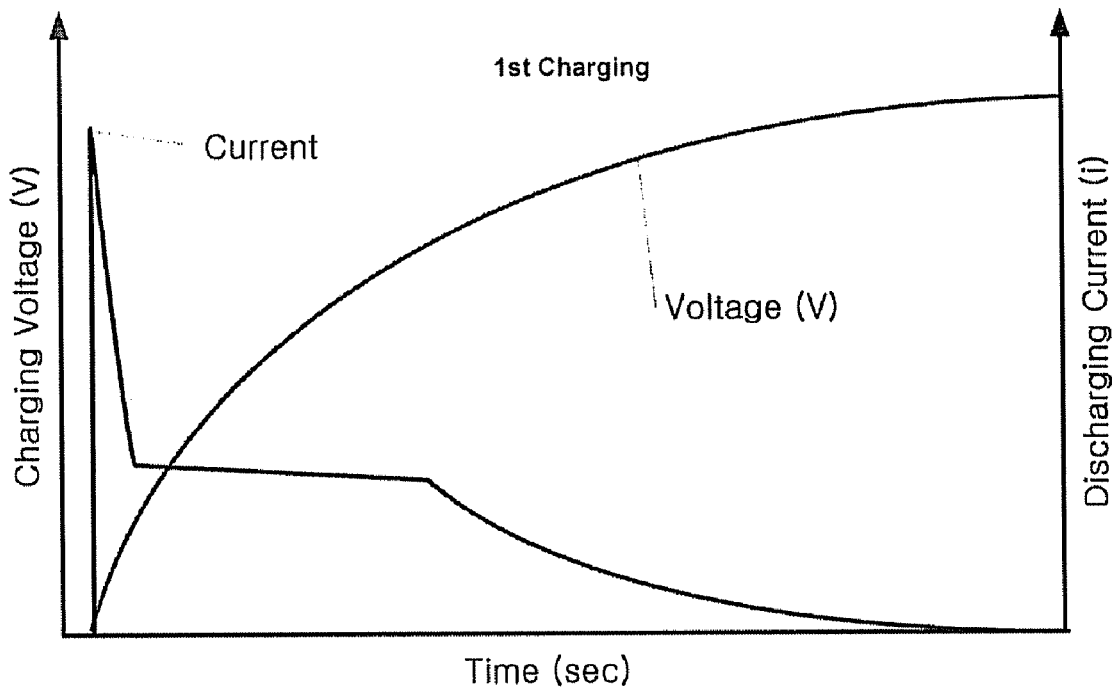
FIG. 4a is a graph showing a charging voltage of the supercapacitor and an inrush current when the existing power supply device is applied.
Figure 4B:
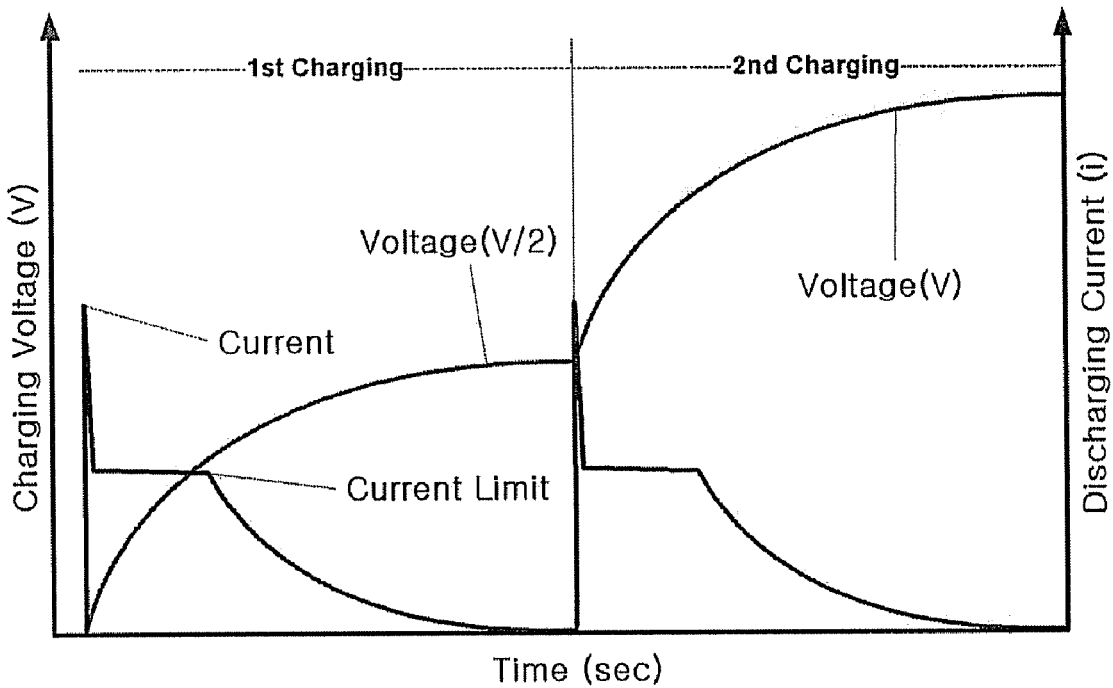
FIG. 4b is a graph showing a charging voltage of the supercapacitor and an inrush current when the supercapacitor according to the present invention is applied.

FIG. 1 shows a configuration of a general instant high power supply device. FIG. 2 is a configuration of an instant high power supply device for a small arms fire control system according to the present invention. FIG. 3 is a graph showing signals of a power control microprocessor and a charging time of a supercapacitor accordingly, of the present invention. FIGS. 4a and 4b are graphs showing a charging voltage of the supercapacitor and an inrush current when the existing power supply device is applied and when the supercapacitor according to the present invention is applied, respectively.

FIG. 1 shows a configuration of a general power supply device for instant high power supply. Power supplied from a battery 1 is supplied to a power supply device 3 and electronic boards 5 within the device. A current value in which a maximum current value, which is always consumed by the electronic boards 5, is deduced from a maximum pulse discharging current of the battery 1, is set to a current limit value of a current limit circuit or a chip 3a. Therefore, a supercapacitor 3c is charged to the limited current value through a step-up DC-DC boost converter 3b. As described above, the charged supercapacitor 3c compensates for the battery 1 when a load 7 requests an instant high power and thus supplies the load 7 with an instant high current.

FIG. 2 shows a configuration of a power supply device for a small arms fire control system according to the present invention. A power supply device 11 includes a power control microprocessor 11a for determining the power supply state of the system in real-time, checking a voltage of a supercapacitor 3c, and performing ON/OFF control of chips used in the power supply device, a first current limit part #1 11b having a low current limit value, a second current limit part #2 11c having a high current limit value, and a Zener diode 11d for reducing an initial inrush current.

A load 7 includes a fuse setter setting board 7a that requires an instant high power of about 7.5 W for 500 milliseconds once every 5 seconds in a shooting mode, a shutter driving circuit 7b that requires an instant high power of about 7.5 W for 300 milliseconds at the time of infrared 1-point 1-correction for infrared zero-point correction, and a laser range finder module driving unit 7c that requires a voltage of 300V and a current of about 0.025 A for 100 milliseconds when driving the laser range finder module.

In an operation of the present invention, if power is supplied from a battery 1, the power control microprocessor 11a of the power supply device 11 turns on the low current limit part #1 11b, and keeps turned off the high current limit part #2 11c, a step-up DC-DC boost converter #1 11e, and a step-up DC-DC boost converter #2 11f.

At this moment, the current that has passed through the low current limit part #1 11b charges the supercapacitor 3c through the Zener diode 11d. The power control microprocessor 11a checks the charging voltage in real-time. If the supercapacitor 3c is charged up to the same voltage level as that of the battery 1, the power control microprocessor 11a turns on the step-up DC-DC boost converter #1 11e and charges the supercapacitor 3c up to a final voltage, and subsequently discharges the charged voltage when the load 7 requires an instant high power.

Further, in order to minimize the leakage current, the laser range finder module driving circuit 7c turns on the step-up DC-DC boost converter #2 11f only when driving the laser range finder module. If the supercapacitor 3c is fully charged and other electronic boards 5 are stabilized after power is first supplied to the system, current consumed by corresponding electronic boards 5 is reduced significantly. For example, in the case of a small arms fire control system, after a main control processor, memory, a Field Programmable Gate Array (FPGA), etc. are stabilized, current consumption of about 400 mA is reduced.

The power control microprocessor 11a that checks the power state of the system in real-time turns off the low current limit part #1 11b and turns on the high current limit part #2 11c in order to return this current to the power supply device. Thus, power required by respective units of the system can be used efficiently within a limited power capacity of the battery 1.

FIG. 3 shows signals of the power control microprocessor and the charging time of the supercapacitor depending on the state and time of the system. From FIG. 3, it can be seen that if the system enters a stabilization step after power is supplied to the system, the power control microprocessor turns on the high current limit part #2 11c, so the charging time of the supercapacitor 3c reduces from Δt1 to Δt2.

FIG. 4 shows an inrush current and a charging state of the supercapacitor, which are generated when the supercapacitor 3c is charged in the event that the existing power supply device is applied (FIG. 4a) and the present invention is applied (FIG. 4b).

As described above, the present invention relates to the design of the power supply device of the small arms fire control system that is driven using the battery and the supercapacitor and requires an instant high power. The present invention can solve problems an increase of the charging time and a reduction of the charging efficiency of the supercapacitor, increased shock to electronic components due to an excessive inrush current, and so on in the existing instant high power supply device.

The power supply device of the present invention can reduce the charging time of the supercapacitor and solve a problem in which the battery is damaged due to excessive current discharging of a battery when charging the supercapacitor by checking the power state of the system in real-time and switching current limit parts with different limit current values using the power control microprocessor. Further, the use efficiency of power can be maximized by properly distributing power of the system.

Furthermore, in charging the supercapacitor using a battery, the supercapacitor is firstly charged through the Zener diode. Thereafter, if the charging voltage of the supercapacitor is the same voltage level as that of the battery as a result of real-time monitoring, the power control microprocessor turns on the step-up DC-DC boost converter and then charges the supercapacitor up to a final voltage. Accordingly, an inrush current can be reduced and the charging efficiency of the supercapacitor can be improved.

Hereinafter, a method of supplying an instant high power to the small arms fire control system as constructed above according to the present invention is described below.

A method of supplying power to the small arms fire control system or a similar small arms system according to the present invention includes a first process of, when power is supplied from a battery, limiting a low current of current supplied to the system from the current limit part, a second process of charging the supercapacitor with the limited current, a third process of, if the supercapacitor is charged to a specific voltage, charging the supercapacitor up to a final voltage, which will be supplied to a load, using the Zener diode and the step-up DC-DC boost converter, and a fourth process of supplying the charged voltage to a load requiring a high power, wherein an instant high power is supplied to the load using a variable current limit and multi-step charging method.

The second process includes charging the supercapacitor in multiple stages using the Zener diode and the step-up DC-DC boost converter in order to minimize an inrush current occurring upon charging.

The method further includes a process of, if the current is charged to the supercapacitor and peripheral boards are stabilized, supplying the charged current to each board.

Further, according to the method, the microprocessor varies a limit current value by switching the current limit part according to a power state, and supplies power to a desired load timely.

Figure 5:
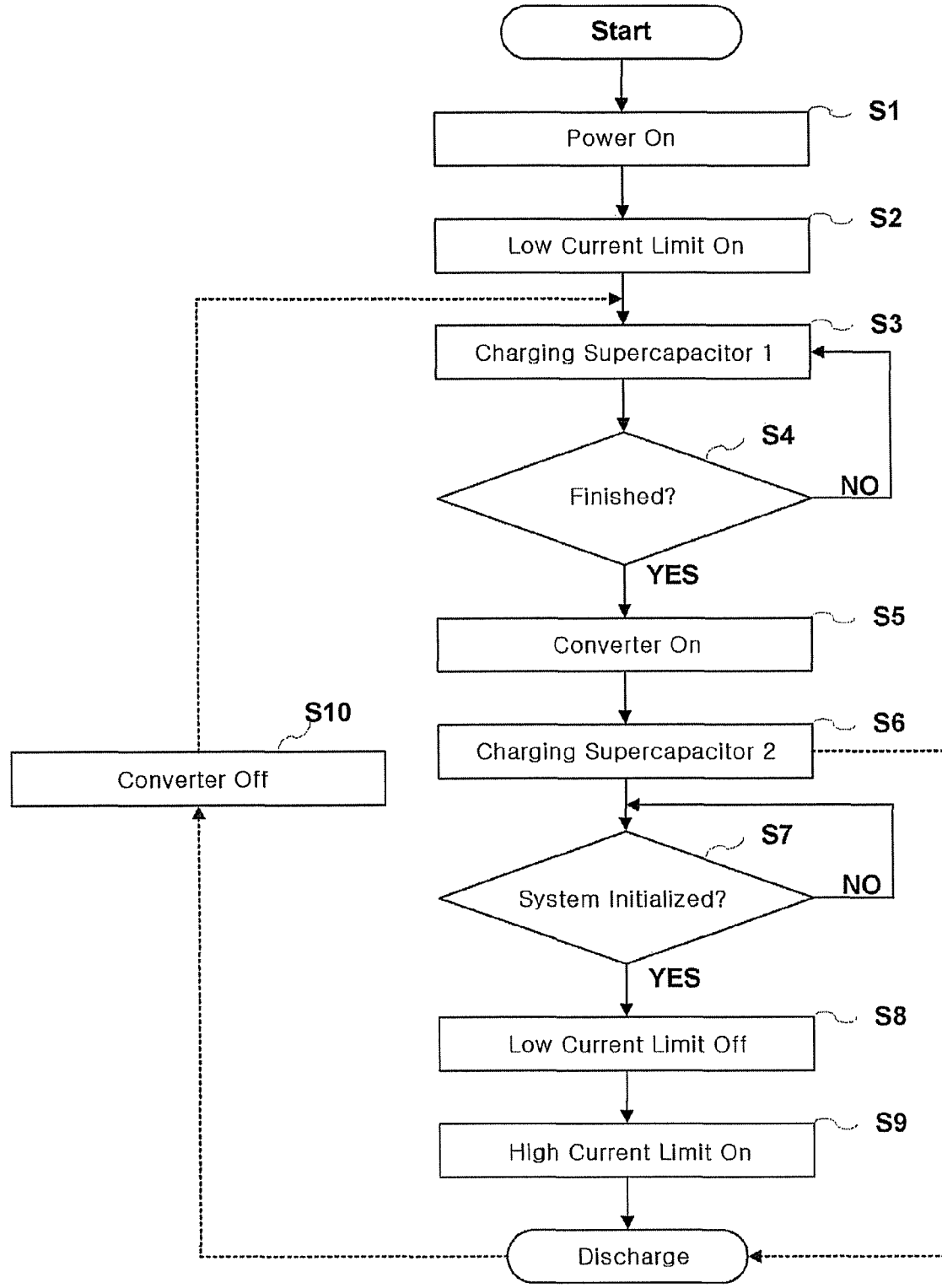
FIG. 5 is a view illustrating a power control method of the power supply device for the small arms fire control system according to the present invention.

FIG. 5 shows a power control method of the power supply device for the small arms fire control system according to the present invention. According to this control method, power is supplied from the battery to the system (S1). A low current of current supplied to the system is limited by the current limit part (S2). The supercapacitor is charged with a limited current of the applied battery power (S3). A specific voltage is charged to the supercapacitor through the Zener diode (S4). If a specific voltage is charged to the supercapacitor, the step-up DC-DC boost converter is turned on (S5) and the supercapacitor is then charged up to a final voltage, which will be supplied to a load, through the step-up DC-DC boost converter (S6). Whether the system has been reset is checked (S7). The low current limit is turned off (S8) and the high current limit is then turned on (S9). The charged voltage is supplied to a load that requires a high power. Thus, an instant high power is supplied to the load using a variable current limit and multi-step charging method. The system reset is performed only once after power is applied. Thus, after the step-up DC-DC boost converter is turned off (S10) since the first discharge, the processes S7, S8 and S9 are not performed again in a state where the power is applied.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

As described above, according to the present invention, in designing a power supply device of a small arms fire control system requiring accurate power control in order to stably supply an instant high power necessary for driving of the laser range finder module and the infrared shutter and energy charging of the fuse setter in a state where a normal operation of a system is guaranteed within a limited discharge capacity of a battery, the power control microprocessor, the variable current limit circuit, a circuit for preventing an inrush current and increasing the charging efficiency of the supercapacitor, and so on are used. Accordingly, there are advantages in that power of an overall system can be managed stably and efficiently and a use time of a battery can be increased.

What is claimed is:

1. A power supply device of a small arms fire control system or a similar small arms system, comprising:
   a first current limit part for limiting a low current when power is supplied from a battery;
   a second current limit part for limiting a high current when the power is supplied from the battery;
   a Zener diode and a step-up DC-DC boost converter connected to the first and second current limit parts, and adapted to primarily charge a supercapacitor to a battery voltage level and subsequently charge the supercapacitor up to a final voltage that will be supplied to a load; and
   a microprocessor for checking a power supply state of the system and a voltage of the supercapacitor in real-time and controlling ON/OFF of the first and second current limit parts used in the system,
   wherein an instant high power is supplied to the load using a variable current limit and multi-step charging method.

2. The power supply device according to claim 1, wherein the Zener diode functions to limit an initial inrush current.

3. The power supply device according to claim 1, wherein when the first current limit part is supplied with power from the battery, it is turned on.

4. The power supply device according to claim 1, wherein if the supercapacitor is fully charged and the system is stabilized, the second current limit part is turned on.

5. The power supply device according to claim 1, wherein when the high power is supplied to the load, the step-up DC-DC boost converter is turned on.

6. A method of supplying power to a small arms fire control system or a similar small arms system, the method comprising:
   a first step of, when power is supplied from a battery, limiting a low current of current supplied to the system from a current limit part;
   a second step of charging a supercapacitor with the limited current;
   a third step of, if the supercapacitor is charged to a specific voltage, charging the supercapacitor up to a final voltage, which will be supplied to a load, using a Zener diode and a step-up DC-DC boost converter; and
   a fourth step of supplying the charged voltage to a load requiring a high power,
   wherein an instant high power is supplied to the load using a variable current limit and multi-step charging method.

7. The method according to claim 6, wherein the second step includes charging the supercapacitor in multiple stages using the Zener diode and the step-up DC-DC boost converter in order to minimize an inrush current occurring upon charging.

8. The method according to claim 6, further comprising a step of, if the current is charged to the supercapacitor and peripheral boards are thus stabilized, supplying power to respective units using the charged current.

9. The method according to claim 6, wherein a microprocessor varies a limit current value by switching the current limit part according to the state of power.

10. The method according to claim 6, wherein the power is supplied to only a desired load timely using a microprocessor.

* * * * *